United States Patent [19]

Yakura et al.

[11] Patent Number: 5,576,224
[45] Date of Patent: Nov. 19, 1996

[54] METHOD FOR MANUFACTURING A MONITOR ELEMENT

[75] Inventors: James P. Yakura, Colorado Springs; Richard K. Cole, Woodland Park; Matthew S. Von Thun, Colorado Springs; Crystal J. Hass, Colorado Springs; Derryl D. J. Allman, Colorado Springs, all of Colo.

[73] Assignees: AT&T Global Information Solutions Company, Dayton, Ohio; Hyundai Electronics America, San Jose, Calif.; Symbios Logic Inc., Fort Collins, Colo.

[21] Appl. No.: 460,287

[22] Filed: Jun. 2, 1995

Related U.S. Application Data

[62] Division of Ser. No. 123,664, Sep. 20, 1993, Pat. No. 5,466,614.

[51] Int. Cl.⁶ .......................... H01L 21/66; H01L 21/465
[52] U.S. Cl. .................. 437/8; 437/228; 427/10; 324/76.75; 374/120; 374/184
[58] Field of Search .................. 437/8, 228; 374/184, 374/120; 427/10; 324/252, 256, 76.75

[56] References Cited

U.S. PATENT DOCUMENTS

| | | | |
|---|---|---|---|
| 2,989,691 | 6/1961 | Cook | 324/34 |
| 3,234,461 | 2/1966 | Trent et al. | 324/62 |
| 3,320,495 | 5/1967 | Fox et al. | 437/228 |
| 3,338,100 | 8/1967 | Takami | 73/351 |
| 3,350,760 | 11/1967 | Kilby | 437/238 |
| 3,391,576 | 7/1968 | Takami et al. | 73/351 |
| 3,544,893 | 12/1970 | Savin et al. | 324/62 |
| 3,781,506 | 12/1973 | Ketchum et al. | 219/10.49 |
| 4,000,458 | 12/1976 | Miller et al. | 324/34 R |
| 4,095,469 | 6/1978 | Yamada et al. | 73/362 R |
| 4,333,225 | 6/1982 | Yeh | 29/571 |
| 4,457,794 | 7/1984 | Kotera et al. | 156/64 |
| 4,924,073 | 5/1990 | Chiba | 219/413 |
| 4,963,827 | 10/1990 | Popovic et al. | 324/251 |
| 5,030,908 | 7/1991 | Miyoshi et al. | 324/158 R |
| 5,119,025 | 6/1992 | Smith et al. | 324/252 |
| 5,140,267 | 8/1992 | Shintaku | 324/248 |
| 5,288,649 | 2/1994 | Keenan | 437/3 |
| 5,439,850 | 8/1995 | Ozturk et al. | 437/228 |
| 5,450,263 | 9/1995 | Desaigoudar et al. | 360/110 |

FOREIGN PATENT DOCUMENTS

| | | |
|---|---|---|
| 0395188 | 10/1990 | European Pat. Off. . |
| 0406751 | 1/1991 | European Pat. Off. . |
| 3113557 | 4/1981 | Germany . |
| 56-48145 | 5/1981 | Japan . |
| 8601595 | 3/1986 | WIPO . |
| 9107736 | 5/1991 | WIPO . |

OTHER PUBLICATIONS

Machine Design, vo. 60, No. 11, May 19, 1988, Cleveland US; pp. 149–173; Anonymous "Sensors and Transducers".

*Primary Examiner*—R. Bruce Breneman
*Assistant Examiner*—Matthew Whipple
*Attorney, Agent, or Firm*—Wayne P. Bailey

[57] ABSTRACT

A method and structure for sensing data such as temperature with respect to objects such as silicon wafers undergoing fabrication or other processes involve the use of a monitor element of material and configuration similar to that of the objects being processed. A structure such as a closed loop or segment of a spiral may be formed on the surface of the monitor element, and acts as a secondary coil when brought into operative relation with a transformer structure which includes a primary coil, a current source and a sensing device. The sensing device senses variations in the electrical characteristics in the primary coil, caused by the presence of the monitor element, and can thereby determine the temperature or other desired data relating to the monitor element, which is substantially the same as comparable data for the objects being processed.

13 Claims, 3 Drawing Sheets

5,576,224

METHOD FOR MANUFACTURING A MONITOR ELEMENT

This is a Division of application Ser. No. 08/123,664, filed Sep. 20, 1993, now U.S. Pat. No. 5,466,614.

BACKGROUND OF THE INVENTION

The present invention relates to a structure and method for remote sensing of process conditions such as temperature at the location of elements undergoing a process, such as the fabrication of silicon wafers, and more particularly relates to the use of a special monitor structure in performing such measurements.

One measurement method in current use involves an optical measurement which measures the black body radiation spectrum or a portion of it which is a function of temperature. This measurement is highly dependent upon the surface conditions of the substrate being measured.

Another measurement method involves the use of a thermocouple. This requires good contact with the wafer for fast and accurate measurements.

SUMMARY OF THE INVENTION

In the novel method of the present invention, substrate temperature and other data are measured by the induction of currents in the substrate of a wafer or other element or in structures built on the surface of the substrate, and by the coupling of these induced currents to a primary solenoid. Possible uses for the method include remote temperature sensing, remote resistivity sensing and line width control and wafer theft protection.

It is accordingly an object of the present invention to provide a novel method for remote measurement of data such as temperature relating to an article which is undergoing a process.

It is another object of the present invention to provide an apparatus for measuring data such as temperature of an article being processed, using a monitor element.

Another object is to provide a monitor element which can be used to measure data such as temperatures of other articles of similar material and configuration in the midst of a process.

Another object is to provide a method for remote measurement of data such as temperature relating to articles being processed, by measuring the effect produced in a transformer structure by eddy currents in an associated monitor element which is undergoing the same process as the articles being processed.

Another object is to provide a method for remote measurement of data such as temperature relating to articles being processed, by measuring the effect produced in a transformer structure by a secondary coil formed on an associated monitor element which is undergoing the same process as the articles being processed.

Additional benefits and advantages of the present invention will become apparent to those skilled in the art to which this invention relates from the subsequent description of the preferred embodiment and the appended claims, taken in conjunction with the accompanying drawings.

DETAILED DESCRIPTION

The purpose of this invention is to provide a structure and method for the remote sensing of process conditions such as temperature for objects such as silicon wafers which are in the course of a process, such as a fabrication process, so that the data obtained, such as temperature data, may be used to monitor the process and alter it, if appropriate. In the present invention, this remote sensing is accomplished by use of a monitor device, which resembles the devices being processed but is capable of having measurement data readily obtained therefrom. Due to the similarity between the monitor device and the objects being processed, the measurement data taken from the monitor device is also accurate for, and applicable to, the objects being processed.

The invention may be used for remote sensing of data for various types of objects. One contemplated use is in connection with the processing of silicon wafers and the determination of the temperature of such wafers during the processing thereof.

Figure 1:
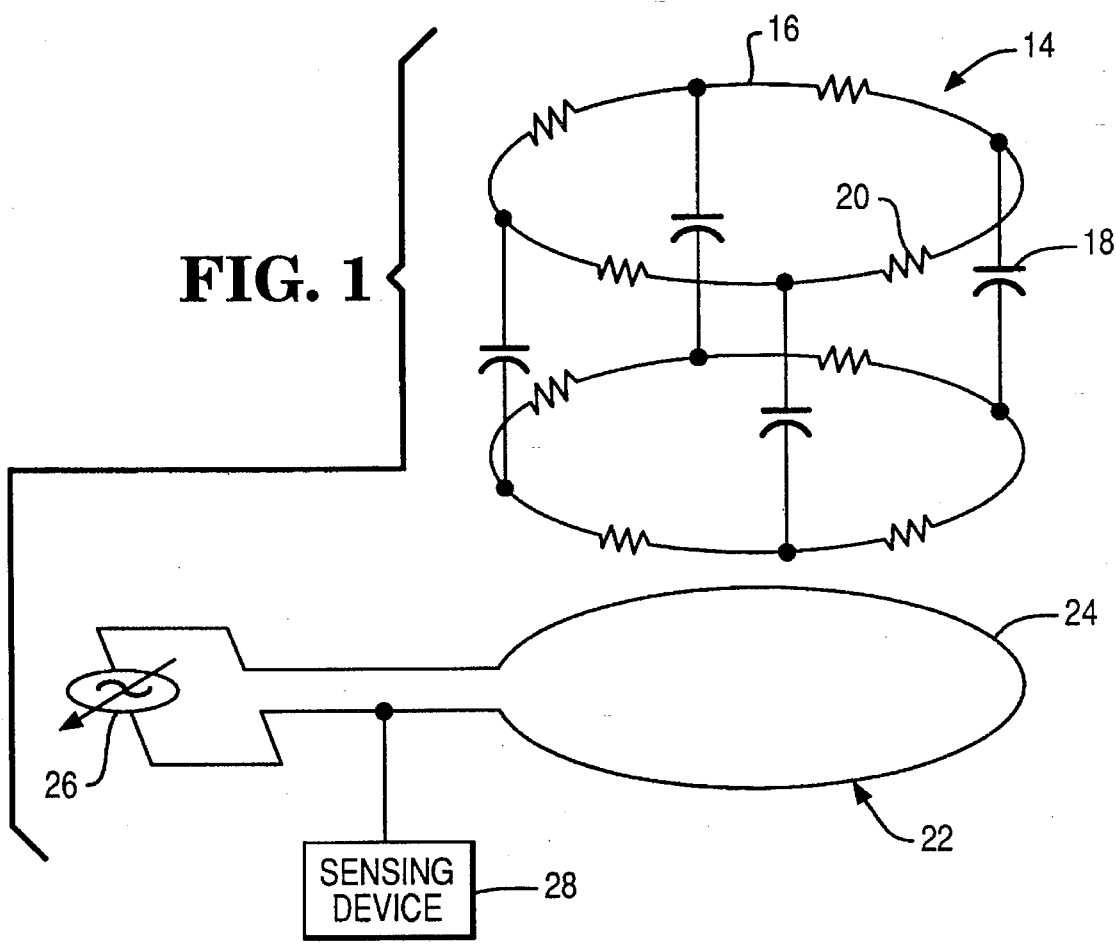
FIG. 1 shows a schematic approximation of a secondary current loop comprising an RC circuit on a wafer which is inductively coupled to a primary coil of a transformer and sensing structure.

In one embodiment of the invention, a monitor wafer 10 (FIG. 2) is prepared for use by forming a structure 12 on its surface, which structure subsequently acts as the secondary current loop of of a transformer. This structure may be considered to be a circular transmission line whose characteristic capacitance and resistive impedances vary in a predetermined fashion with ambient conditions such as temperature. For a given structure and set of ambient conditions, this secondary current loop may be expected to have a characteristic resonant frequency. In FIG. 1, a representation 14 of the secondary current loop is shown as comprised of a circuit 16 including a plurality of capacitances 18 and a plurality of resistances 20. The circuit 16 is shown as located in operative relationship with a representation of a transformer structure 22 which includes a primary coil 24, a current source 26 and a sensing device 28 which is capable of sensing electrical measurements from the primary coil 24.

Figure 3:
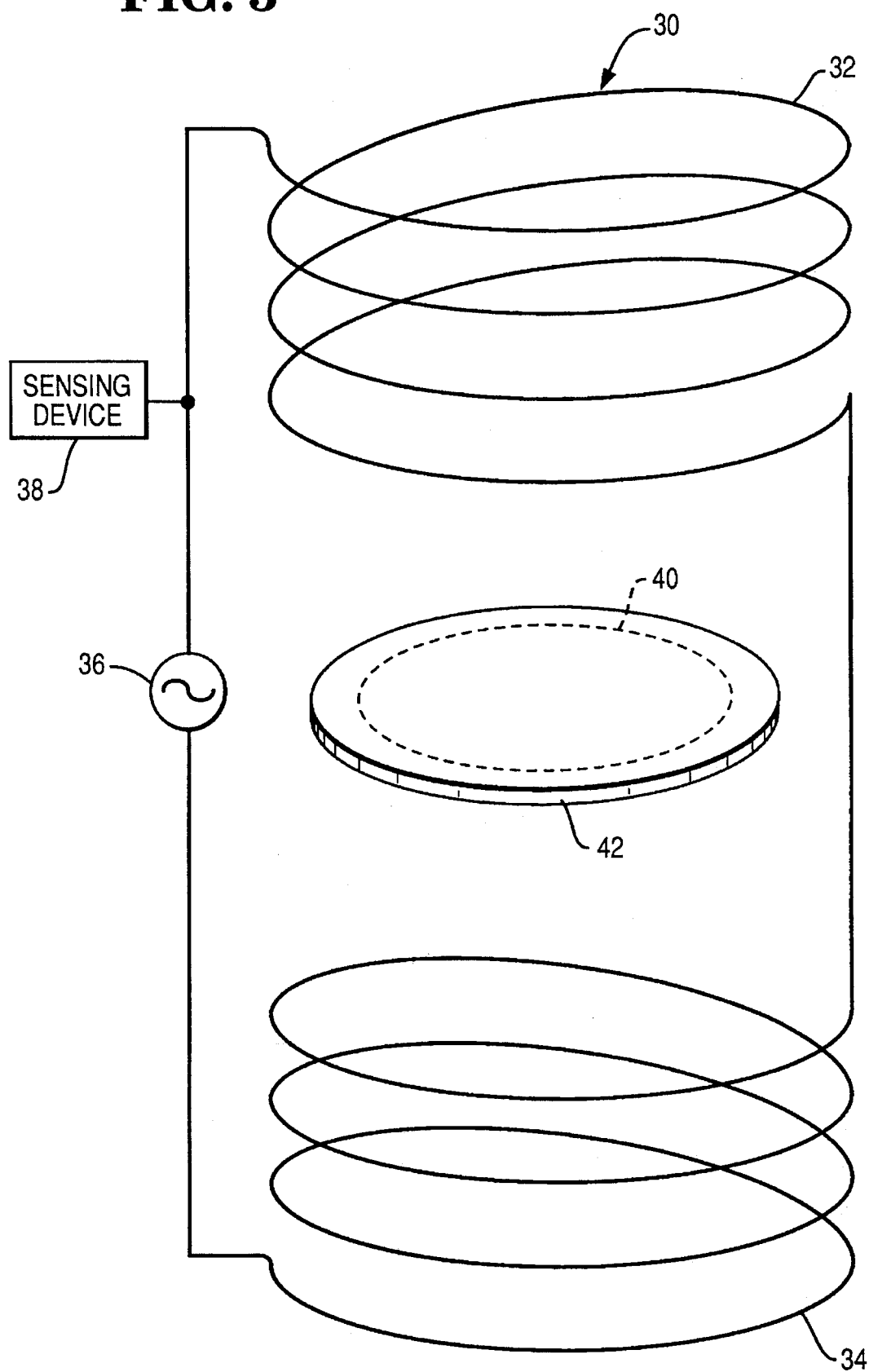
FIG. 3 is a diagrammatic view of a wafer located in operative relation to a transformer and sensing structure.

A similar arrangement is shown in FIG. 3, in which a transformer structure 30 includes two coupled primary coils 32, 34, a current source 36 and a sensing device 38. A secondary coil 40 forms part of a monitor wafer 42 which is positioned between the primary coils 32, 34.

Figure 2:
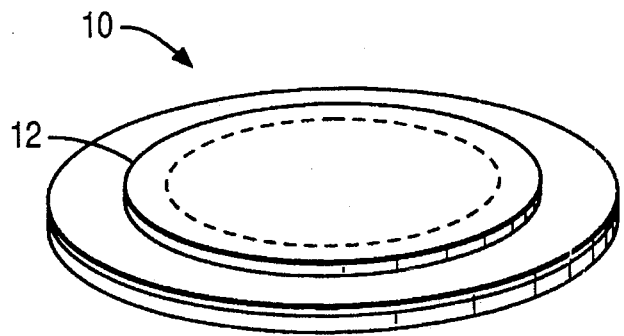
FIG. 2 is a diagrammatic view of a closed secondary current loop which has been deposited on a substrate.
Figure 4:
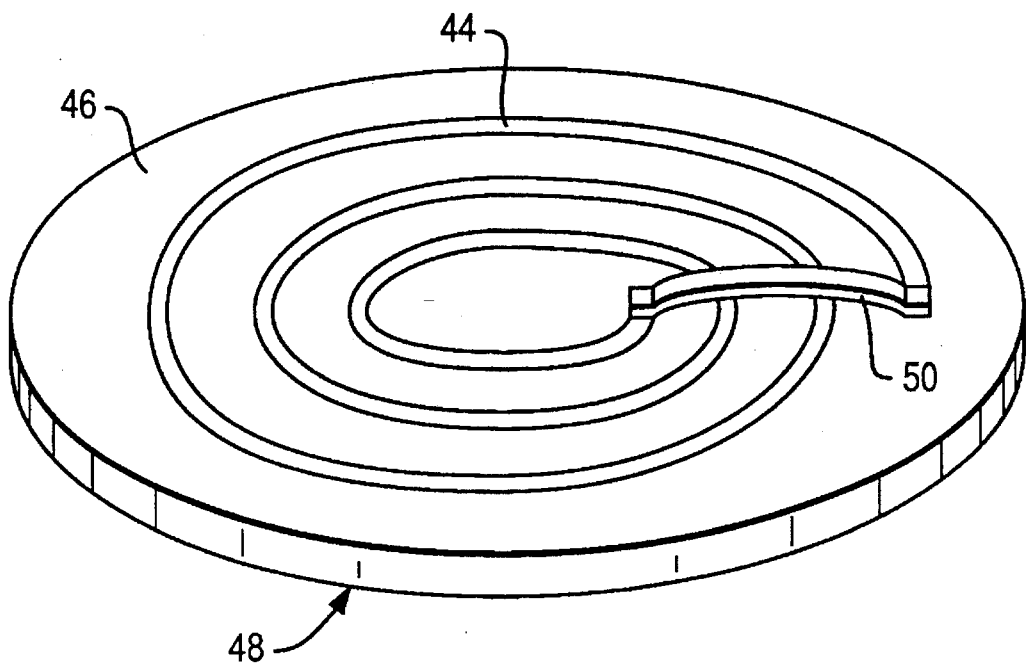
FIG. 4 is a diagrammatic view of a spiral segment with connecting strap which has been deposited on a substrate.

The secondary current loop is not limited to the closed continuous current loop structure shown in FIG. 2. Other appropriate configurations may be employed, if desired. One such configuration is shown in FIG. 4, in which a portion of a spiral 44 is located on a surface 46 of a wafer 48. The ends of the spiral segment are joined by a conductive, resistive or semiconductive strap 50 which is insulated by a suitable insulating layer (not shown) from the portions of the spiral 44 over which it passes.

In another form, a silicon wafer without a loop structure thereon may be employed as a monitor wafer. Locating such a wafer in operative relation with respect to the primary coil of a transformer structure and the application of power to the primary coil will induce eddy currents in the wafer, which in turn will affect the electrical measurements taken from the transformer structure by a sensing device. These measurements may then be used, after proper calibration, to determine desired data, such as temperature, relating to the monitor wafer. Since the monitor wafer is made of the same material and has the same configuration as the wafers actually being processed, this same temperature or other value is also applicable to the wafers being processed.

Figure 5:
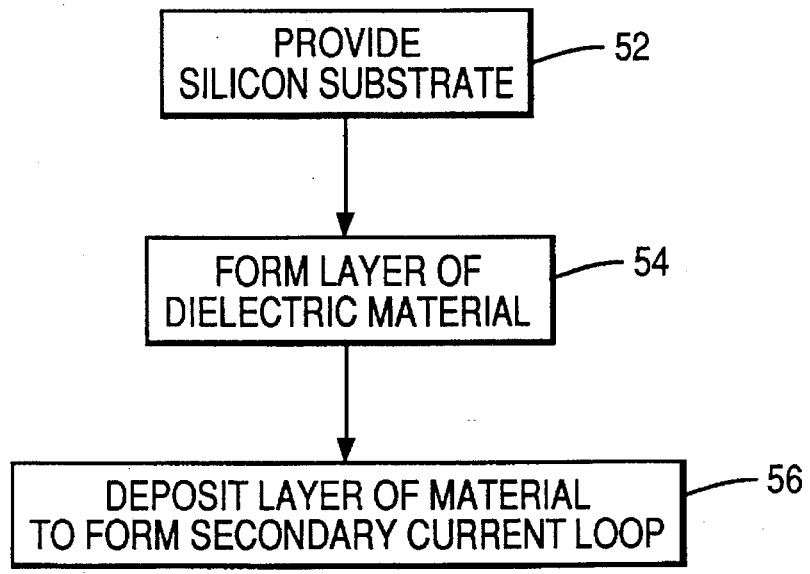
FIG. 5 is a flow diagram showing steps in the fabrication of a monitor element.

The secondary loop of FIG. 2 may be formed in the manner shown in the flow diagram of FIG. 5. As represented in block 52, a substrate of doped or undoped silicon is provided. Upon that substrate, as represented in block 54, a layer of dielectric material is formed. Any suitable dielectric layer may be employed, with one suitable material being silicon dioxide. Upon the dielectric, as represented by block 56, a layer of conductive, resistive or semiconductive material is deposited. A suitable conductive material is Ruthenium, a suitable resistive material is doped polysilicon, and a suitable semiconductive material is doped silicon. This final layer is patterned to form a closed continuous loop if the embodiment of FIG. 2 is desired, or is patterned to form a segment of a spiral if the embodiment of FIG. 4 is desired. In the event that the spiral configuration of FIG. 4 is selected, a strap 50 connecting the ends of the spiral segment must also be deposited. The strap 50 may be made of a suitable conductive or semiconductive material, such as, for example, Ruthenium.

The present invention may find use in a number of different applications. One such application is in the periodic determination of temperature of a group or batch of silicon wafers which are being processed in the course of manufacture of semiconductor devices. In such a process, it is desirable to avoid actual contact with the silicon wafers in order to avoid possible contamination. Accordingly, a monitor wafer, being made from the same material and having the same configuration as the wafers being processed, can be included in the batch of wafers being processed, and its temperature, which will be essentially identical to the temperature of the other wafers in the batch, can be ascertained. This can be done without actual physical contact with the monitor wafer, as shown in FIG. 3, by causing a monitor wafer 42 having a secondary coil 40, to come into operative relation with the primary coils 32, 34 of a transformer structure 30, and detecting by use of the sensing device 38 the resulting change in electrical characteristics. By appropriate calibration, the change in electrical characteristics can be converted to indicate the temperature of the monitor wafer 42, which will be essentially identical to the temperature of the actual wafers being processed. As previously indicated, the structure on the monitor wafer may be of any suitable form, including the closed loop of FIG. 2 and the strapped spiral segment of FIG. 4. As has also been previously described, if desired, the monitor wafer can dispense with any supplemental structure, with a change in internal eddy currents, when exposed to the field from the primary coils of the transformer structure, being relied upon to produce a change in the current in the primary coils which can be sensed by a sensing device and converted to a temperature value.

Although the invention has been described with particular reference to a preferred embodiment thereof, variations and modifications of the present invention can be effected within the spirit and scope of the following claims.

What is claimed is:

1. A process for fabricating a monitor element, said monitor element being a coil, comprising the following steps:
   (a) providing a silicon substrate;
   (b) forming a layer of dielectric material on said silicon substrate; and
   (c) depositing on the dielectric a layer of material to form said coil.

2. The process of claim 1, in which said layer of material of step (c) is formed in a continuous closed loop.

3. The process of claim 1, in which the silicon substrate is doped.

4. The process of claim 1, in which the silicon substrate is undoped.

5. The process of claim 1, in which the layer of material of step (c) is conductive material.

6. The process of claim 1, in which the layer of material of step (c) is resistive material.

7. The process of claim 1, in which the layer of material of step (c) is semiconductive material.

8. A process for fabricating a monitor element, comprising the following steps:
   (a) providing a silicon substrate;
   (b) forming a layer of dielectric material on said silicon substrate; and
   (c) depositing on the dielectric a layer of material to form a coil, in which said layer of material is formed as a portion of a spiral, the ends of which are joined by a strap, which is insulated from the portions of the spiral over which it passes.

9. The process of claim 8, in which said strap is formed of semiconductive material.

10. A process for fabricating a monitor element, comprising the following steps:
    (a) providing a silicon substrate;
    (b) forming a layer of dielectric material on said silicon substrate; and
    (c) depositing on the dielectric a layer of material to form a coil, in which the layer of material is semiconductive material.

11. The process of claim 10, in which said layer of material of step (c) is formed in a continuous closed loop.

12. The process of claim 10, in which the silicon substrate is doped.

13. The process of claim 10, in which the silicon substrate is undoped.

* * * * *